(12) United States Patent
Pore et al.

(10) Patent No.: US 11,990,333 B2
(45) Date of Patent: May 21, 2024

(54) METHOD AND APPARATUS FOR FILLING A GAP

(71) Applicant: ASM IP Holding B.V., Almere (NL)

(72) Inventors: Viljami Pore, Helsinki (FI); Werner Knaepen, Leuven (BE); Bert Jongbloed, Oud-Heverlee (BE); Dieter Pierreux, Pepingen (BE); Gido van Der Star, Leuven (BE); Toshiya Suzuki, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/208,398

(22) Filed: Jun. 12, 2023

(65) Prior Publication Data
US 2023/0335397 A1  Oct. 19, 2023

Related U.S. Application Data

(63) Continuation of application No. 17/370,197, filed on Jul. 8, 2021, now Pat. No. 11,694,892, which is a (Continued)

(51) Int. Cl.
*H01L 21/02* (2006.01)
*C23C 16/04* (2006.01)
*C23C 16/455* (2006.01)
*C23C 16/50* (2006.01)
*H01L 21/762* (2006.01)

(52) U.S. Cl.
CPC ........ *H01L 21/0228* (2013.01); *C23C 16/045* (2013.01); *C23C 16/45525* (2013.01); *C23C 16/45527* (2013.01); *C23C 16/45536* (2013.01); *C23C 16/50* (2013.01); *H01L 21/02164* (2013.01); *H01L 21/0217* (2013.01); *H01L 21/02178* (2013.01); *H01L 21/02211* (2013.01);
(Continued)

(58) Field of Classification Search
CPC .......... H01L 21/0228; H01L 21/02164; H01L 21/0217; H01L 21/02178; H01L 21/02211; H01L 21/02219; H01L 21/02274; H01L 21/76224; C23C 16/045; C23C 16/45525; C23C 16/45527; C23C 16/45536; C23C 16/50
See application file for complete search history.

(56) References Cited

U.S. PATENT DOCUMENTS 7,625,820 B1   12/2009  Papasouliotis et al.
9,355,839 B2    5/2016  Swaminathan et al.
(Continued)

*Primary Examiner* — Yasser A Abdelaziez
(74) *Attorney, Agent, or Firm* — Snell & Wilmer L.L.P.

(57) ABSTRACT

There is provided a method of filling one or more gaps by providing the substrate in a reaction chamber and introducing a first reactant to the substrate with a first dose, thereby forming no more than about one monolayer by the first reactant on a first area; introducing a second reactant to the substrate with a second dose, thereby forming no more than about one monolayer by the second reactant on a second area of the surface, wherein the first and the second areas overlap in an overlap area where the first and second reactants react and leave an initially unreacted area where the first and the second areas do not overlap; and, introducing a third reactant to the substrate with a third dose, the third reactant reacting with the first or second reactant remaining on the initially unreacted area.

20 Claims, 3 Drawing Sheets

Related U.S. Application Data continuation of application No. 16/827,506, filed on Mar. 23, 2020, now Pat. No. 11,107,676, which is a continuation of application No. 16/317,774, filed as application No. PCT/IB2017/001015 on Jul. 14, 2017, now Pat. No. 10,741,385, which is a continuation of application No. 15/222,715, filed on Jul. 28, 2016, now Pat. No. 9,887,082.

(52) U.S. Cl.
CPC .. *H01L 21/02219* (2013.01); *H01L 21/02274* (2013.01); *H01L 21/76224* (2013.01)

(56) References Cited

U.S. PATENT DOCUMENTS

| | | |
|---|---|---|
| 2010/0041179 A1 | 2/2010 | Lee |
| 2010/0099236 A1 | 4/2010 | Kwon et al. |
| 2010/0130015 A1 | 5/2010 | Nakajima et al. |
| 2011/0155049 A1* | 6/2011 | Solomon ................. C30B 25/10 118/733 |
| 2013/0164942 A1 | 6/2013 | Kato et al. |
| 2013/0210241 A1 | 8/2013 | LaVoie et al. |
| 2015/0243545 A1 | 8/2015 | Tang et al. |
| 2016/0148800 A1 | 5/2016 | Henri et al. |
| 2016/0148839 A1* | 5/2016 | Abelson ................. C23C 16/18 438/608 |

* cited by examiner

METHOD AND APPARATUS FOR FILLING A GAP

CROSS-REFERENCE TO RELATED APPLICATIONS

This application is a continuation of U.S. patent application Ser. No. 17/370,197, filed Jul. 8, 2021, and titled METHOD AND APPARATUS FOR FILLING A GAP; which is a continuation of U.S. patent application Ser. No. 16/827,506, filed Mar. 23, 2020, and titled METHOD AND APPARATUS FOR FILLING A GAP (now U.S. Pat. No. 11,107,676 issued Aug. 31, 2021); which is a continuation of U.S. patent application Ser. No. 16/317,774, filed Jan. 14, 2019, and titled METHOD AND APPARATUS FOR FILLING A GAP (now U.S. Pat. No. 10,741,385 issued on Aug. 11, 2020); which is a national stage application of International Application No. PCT/IB2017/001015, filed Jul. 14, 2017, and titled METHOD AND APPARATUS FOR FILLING A GAP; which is a continuation of U.S. patent application Ser. No. 15/222,715, filed Jul. 28, 2016 (now U.S. Pat. No. 9,887,082, issued on Feb. 6, 2018), and titled METHOD AND APPARATUS FOR FILLING A GAP, the disclosures of which are hereby incorporated by reference in their entireties.

FIELD

The present invention generally relates to methods and apparatus for manufacturing electronic devices.

More particularly, the invention relates to a method and apparatus for filling one or more gaps created during manufacturing of a feature on a substrate by providing the substrate in a reaction chamber and providing a deposition method comprising;
  introducing a first reactant to the substrate with a first dose, thereby forming no more than about one monolayer by the first reactant on a first area of the surface of the one or more gaps;
  introducing a second reactant to the substrate with a second dose, thereby forming no more than about one monolayer by the second reactant on a second area of the surface of the one or more gaps; and,
  allowing the first and second reactants to react.

BACKGROUND

During manufacturing of an integrated circuit on a substrate gaps e.g. trenches can be created on the substrate. Filling the trenches can take a variety of forms depending upon the specific application.

The basic trench filling process may be subjected to drawbacks, including void formation in the trench during refill. Voids may be formed when the refilling material forms a constriction near the top of the trench before it is completely filled. Such voids may compromise device isolation of the devices on the integrated circuit (IC) as well as the overall structural integrity of the IC. Unfortunately, preventing void formation during trench fill may often place size constraints on the trenches, which may limit device packing density of the devices.

If the trenches are filled for device isolation a key parameter in measuring the effectiveness of device isolation may be the field threshold voltage, that is, the voltage necessary to create a parasitic current linking adjacent isolated devices. The field threshold voltage may be influenced by a number of physical and material properties, such as trench width, dielectric constant of the trench filling material, substrate doping, field implant dose and substrate bias.

Void formation may be mitigated by decreasing trench depth and/or tapering trench sidewalls so that the openings may be wider at the top than at the bottom. A trade off in decreasing the trench depth may be reducing the effectiveness of the device isolation, while the larger top openings of trenches with tapering sidewalls may use up additional integrated circuit real estate.

SUMMARY

It is an objective, for example, to provide an improved or at least alternative gap filling method.

Accordingly, there is provided a method of filling one or more gaps created during manufacturing of a feature on a substrate by providing the substrate in a reaction chamber and providing a deposition method comprising;
  introducing a first reactant to the substrate with a first dose, thereby forming no more than about one monolayer by the first reactant on a first area of the surface of the one or more gaps;
  introducing a second reactant to the substrate with a second dose, thereby forming no more than about one monolayer by the second reactant on a second area of the surface of the one or more gaps, wherein
  the first and the second areas overlap in an overlap area where the first and second reactants react and leave an initially unreacted area where the first and the second areas do not overlap; and,
  introducing a third reactant to the substrate with a third dose, the third reactant reacting with the first or second reactant remaining on the initially unreacted area.

By having the dose of the first and second reactants such that the reactants overlap in an overlap area in the top of the gap the first and second reactants will react in the top of the gap blocking further reactions in the top of the gap. In an initially unreacted area in the bottom of the gap where the first and the second reactant did not overlap, the reactant may still react with the third reactant and thereby filling the gap from the bottom upwards.

According to a further embodiment there is provided a semiconductor processing apparatus, for example, to provide an improved or at least alternative gap filling method. The apparatus comprising:
  one or more reaction chambers for accommodating a substrate provided with gaps created during manufacturing of a feature on the substrate;
  a first source for a first reactant in gas communication via a first valve with one of the reaction chambers; and,
  a second source for a second reactant in gas communication via a second valve with one of the reaction chambers; wherein the apparatus comprises:
  a third source for a third reactant in gas communication via a third valve with one of the reaction chambers;
  a controller operably connected to the first, second and third gas valve and configured and programmed to control:
    introducing a first reactant to the substrate with a first dose, thereby forming no more than about one monolayer by the first reactant on a first area of the surface of the one or more gaps;
    introducing a second reactant to the substrate with a second dose, thereby forming no more than about one monolayer by the second reactant on a second area of the surface of the one or more gaps, the first and the second areas overlap in an overlap area where the first and second reactants react and leave an initially unreacted areas where the first and the second area do not overlap; and, introducing a third reactant to the substrate with a third dose, the third reactant reacting with the first or second reactant remaining on the initially unreacted area.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention.

Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWINGS

These and other features, aspects, and advantages of the invention disclosed herein are described below with reference to the drawings of certain embodiments, which are intended to illustrate and not to limit the invention.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Figure 2:
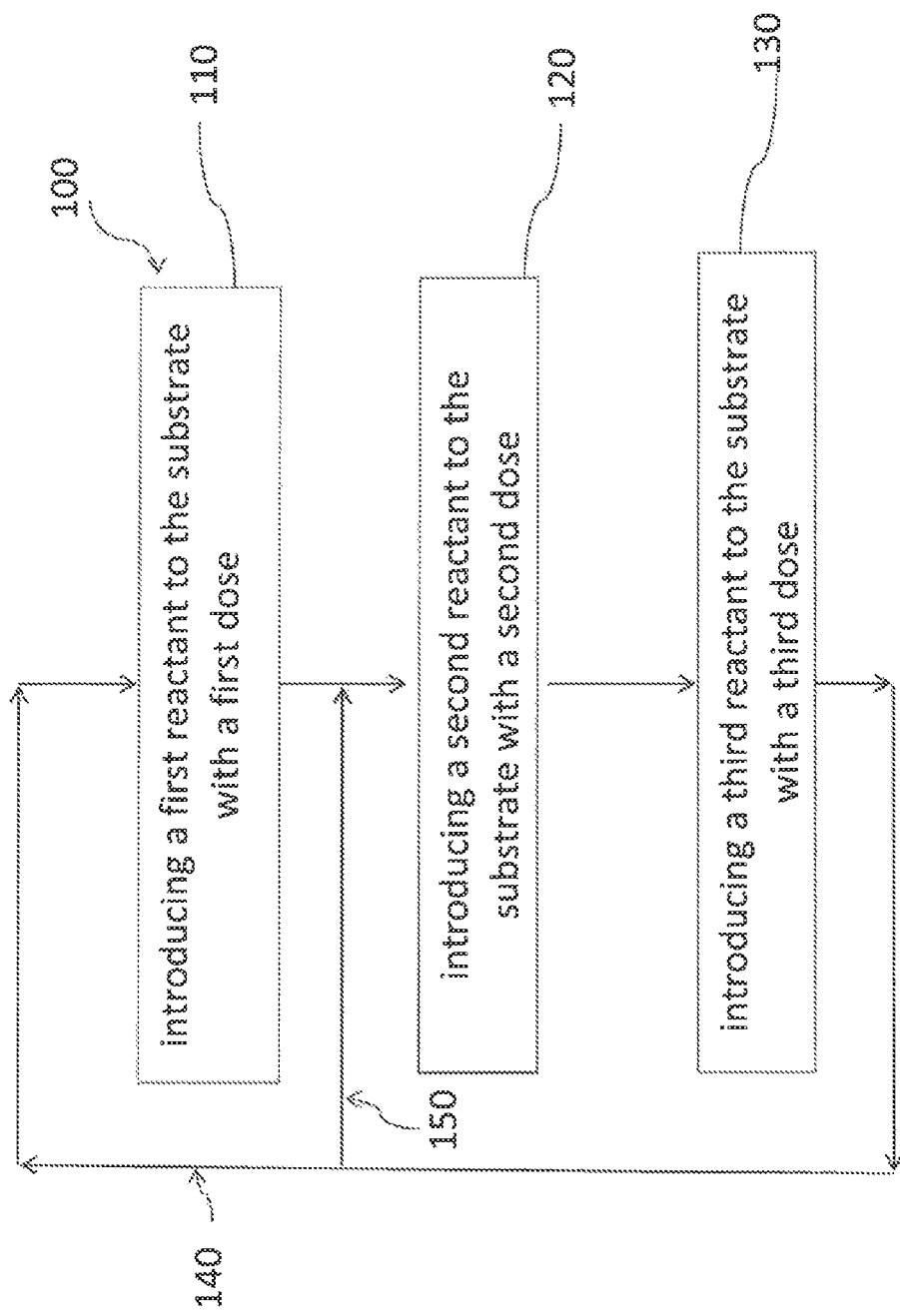
FIG. 2 is a flowchart of a method for filling a gap in accordance with a first embodiment.

FIG. 2 is a flowchart of a method in accordance with at least a first embodiment of the invention in which one or more gaps created during manufacturing of a feature on a substrate may be filled by a deposition method 100. The gaps may be less than 40 or even 20 nm wide. The gaps may be more than 40, 100, 200 or even 400 nm deep.

A substrate may be provided and a deposition method 100 may be provided comprising:

introducing in step 110 a first reactant to the substrate with a first dose, thereby forming no more than about one monolayer by the first reactant on a first area of the surface of the one or more gaps;

introducing in step 120 a second reactant to the substrate with a second dose, thereby forming no more than about one monolayer by the second reactant on a second area of the surface of the one or more gaps, wherein the first and the second areas overlap in an overlap area where the first and second reactants react and leave an initially unreacted areas where the first and the second area do not overlap; and, introducing in step 130 a third reactant to the substrate with a third dose, the third reactant reacting with the first or second reactant remaining on the initially unreacted area.

By having the dose of the first and second reactants such that the reactants overlap in the top of the gap the first and second reactants may react in the top blocking further reactions in the top of the gap. In the bottom of the gap where the first and the second reactants did not overlap, the reactant may still react with the third reactant filling the gap bottom up.

The dose of one of the first and the second reactant should be saturating (e.g. relatively high and/or long) so that said one of the first and second reactant covers the whole gap while the dose of the other one of the first and second reactant should be subsaturating (e.g. relatively short and/or low) to assure that the first and second reactants only overlap in the top of the gap.

Excess reactant and byproduct may be removed after introducing a first, second and/or third reactant to circumvent direct reactions between the reactants causing contamination.

The deposition method 100 may be repeated multiple times to fill the gap as depicted by the loop 140. The reaction may be repeated 1 to 10.000 times, preferably 5 to 2.000 times and most preferably between 10 and 1.000 times via the loop 140.

The deposition method 100 may also be repeated partly via loop 150 if, for example, the top of the gap is still blocked the reactants for reaction in the bottom may still be provided. Also combinations of a complete repeat via loop 140 and a partly repeat via loop 150 may be made. In this way the speed of the gap fill method may be increased.

One of the first and the second reactants is introduced with a saturating (e.g. relatively large or long dose) and the other one of the first and second reactants is introduced with a subsaturating (e.g. relatively low or short dose). The reactant which is provided with the saturating dose will penetrate deep in the gap to reach the bottom of the gap whereas the reactant that is provided with the subsaturating dose will not penetrate deep in the gap and stay in the top. The reaction between the first and second reactant may therefore only occur in the top of the gap blocking further reaction in the top of the gap.

One of the first and the second reactants may be a potential growth reactant whereas the other one of the first and second reactants may comprise a low growth reactant providing a relatively low growth in combination with the potential growth reactant. The reaction between the first and second reactants may therefore result in a relatively low growth in the top of the gap such that the top of the gap may not be blocked before the bottom of the gap is substantially filled.

One of the first and the second reactants may be introduced to cover said corresponding one of the first and second areas which substantially covers the total surface of the one or more gaps. The one of the first and second reactants may be the potential growth reactant providing potentially growth dependent on the other reactant.

The one of the first and second reactants which is the potential growth reactant, may comprise silicon. For example, the potential growth reactant may comprise silanediamine such as N,N,N',N'-tetraethyl silanediamine, such as sold by Air Liquide (Paris, France) under the name ALOHA™ SAM.24.

The substantial low growth reactant may comprise nitrogen which may optionally be activated by a plasma. Nitrogen in combination with a potential growth reactant, such as for example a silanediamine such as N,N,N',N'-tetraethyl silanediamine may result in a relatively low growth in the top of the gap. It may be advantageously to provide the substantial low growth reactant before providing the potential growth reactant.

The third reactant may comprise a high growth reactant providing a relatively high growth in combination with the potential growth reactant. The third reactant may be introduced with a relatively large dose to ensure that the bottom of the gap is reached by the third reactant so that the third reactant may react with the potential growth reactant in the bottom of the gap. Reaction in the top of the trench for the third reactant is blocked because the first and the second reactant may already have been reacted in the top of the gap.

The third reactant may comprise oxygen which may be activated by a plasma. Oxygen in combination with silanediamine such as N,N,N',N'-tetraethyl silanediamine may result in a relatively high growth in the bottom of the gap.

For example, one may provide N,N,N',N'-tetraethyl silanediamine, N plasma, and then O plasma in a cyclic repetitive reaction to fill the gap bottom up. Alternatively, one may provide N plasma, N,N,N',N'-tetraethyl silanediamine, and then O plasma in a cyclic repetitive reaction to fill the gap bottom up.

Figure 3:
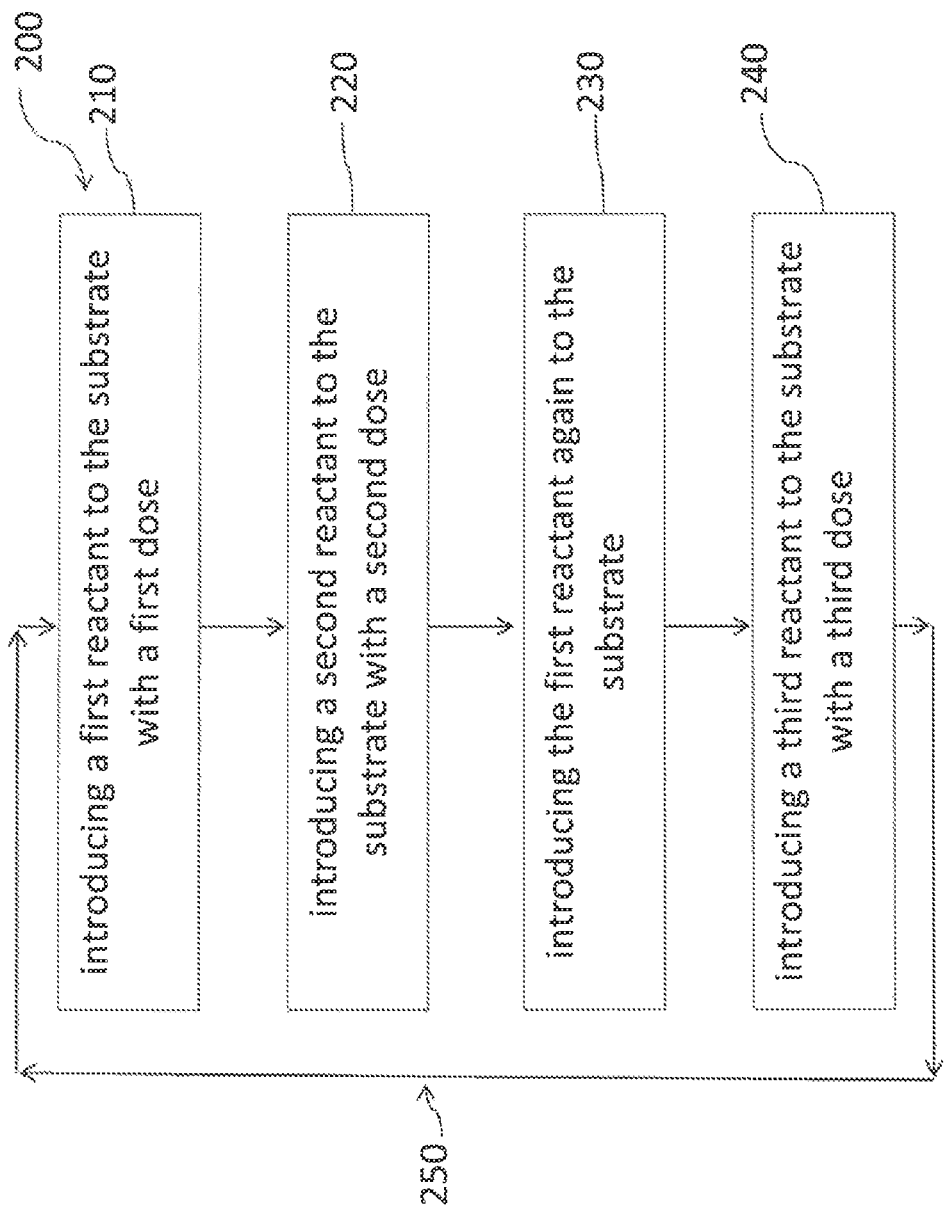
FIG. 3 is a flowchart of a method for filling a gap in accordance with a second embodiment.

FIG. 3 is a flowchart of a method 200 in accordance with at least a second embodiment of the invention wherein in between introducing the second and the third reactant it may be beneficial to introduce one of the first and second reactant again to the substrate before the third reactant is provided.

A substrate may be provided in a reaction chamber and a deposition method 200 may be provided comprising:
  introducing in step 210 a first reactant to the substrate with a first dose, thereby forming no more than about one monolayer by the first reactant on a first area of the surface of the one or more gaps;
  introducing in step 220 a second reactant to the substrate with a second dose, thereby forming no more than about one monolayer by the second reactant on a second area of the surface of the one or more gaps,
  introducing in step 230 the first reactant again to the substrate with a first dose, thereby forming no more than about one monolayer by the first reactant on a first area of the surface of the one or more gaps; wherein the first and the second area overlap in an overlap area where the first and second reactants react and leave an initially unreacted area where the first and the second area do not overlap; and,
  introducing in step 240 a third reactant to the substrate with a third dose, the third reactant reacting with the first or second reactant remaining on the initially unreacted area.

For example, one may provide N,N,N',N'-tetraethyl silanediamine, N plasma, O plasma and then N plasma in a cyclic repetitive reaction to fill the gap bottom up. The reaction may be repeated 1 to 10.000 times, preferably 5 to 2000 times and most preferably between 10 and 1000 times. By doubling the nitrogen plasma steps in the sequence it is better assured that the reactant in the top have reacted and are deactivated before the third reactant O plasma is provided.

The third reactant may comprise ozone, and/or hydrogenperoxide which in combination with silanediamine such as N,N,N',N'-tetraethyl silanediamine may result in high growth. Ozone, and/or hydrogenperoxide do not need to be activated by a plasma to react with the silanediamine to provide for relatively high growth and that is beneficial because the energy of the plasma may be lower deep in the gap.

The potential growth reactant may comprise an organometal e.g. an organoaluminium such as trimethylaluminium (TMA).

If the potential growth reactant may comprise an organometal e.g. an organoaluminium such as trimethylaluminium (TMA) the substantial low growth reactant may comprise ozone. Ozone in combination with trimethylaluminium may result in low growth in the top of the gap.

The third reactant may comprise hydrogen peroxide, which in combination with trimethylaluminium may result in high growth in the bottom of the gap.

The third reactant may comprise hydrazine which in combination with trimethylaluminium may result in high growth in the bottom of the gap.

The third reactant may comprise water which in combination with trimethylaluminium may result in high growth in the bottom of the gap.

The method may be performed in a semiconductor processing apparatus comprising:
  one or more reaction chambers for accommodating a substrate provided with gaps created during manufacturing of a feature on the substrate;
  a first source for a first reactant in gas communication via a first valve with one of the reaction chambers; and,
  a second source for a second reactant in gas communication via a second valve with one of the reaction chambers; wherein the apparatus comprises:
  a third source for a third reactant in gas communication via a third valve with one of the reaction chambers;
  a controller operably connected to the first, second and third gas valve and configured and programmed to control:
    introducing a first reactant to the substrate with a first dose, thereby forming no more than about one monolayer by the first reactant on a first area of the surface of the one or more gaps;
    introducing a second reactant to the substrate with a second dose, thereby forming no more than about one monolayer by the second reactant on a second area of the surface of the one or more gaps,
    the first and the second areas overlap in an overlap area where the first and second reactants react and leave an initially unreacted areas where the first and the second area do not overlap; and,
    introducing a third reactant to the substrate with a third dose, the third reactant reacting with the first or second reactant remaining on the initially unreacted area.

Optionally, the apparatus may be provided with a heater to activate the reactions by elevating the temperature of one or more of the substrate, the first, second and third reactants. Exemplary single wafer reactors, designed specifically to perform ALD processes, are commercially available from ASM International NV (Almere, The Netherlands) under the tradenames Pulsar®, Emerald®, Dragon® and Eagle®. Exemplary batch ALD reactors, designed specifically to perform ALD processes, are commercially also available from and ASM International N.V under the tradenames A400™ and A412™.

Optionally, the apparatus may be provided with a radiofrequency source operably connected with the controller constructed and arranged to produce a plasma of the first, second or third reactant. The plasma enhanced atomic layer deposition PEALD may be performed in an Eagle® XP8 PEALD reactor available from ASM International N.V. of Almere, the Netherlands which apparatus comprises a plasma source to activate one or more of the reactants.

Figure 1A:
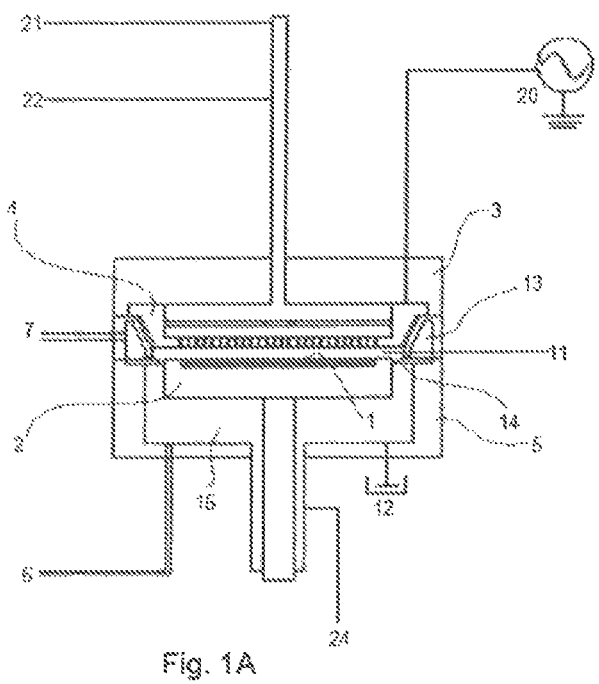
FIG. 1A is a schematic representation of a PEALD (plasma-enhanced atomic layer deposition) apparatus for filling a gap usable in an embodiment of the present invention.

The process cycle with a plasma may be performed using an apparatus illustrated in FIG. 1A, for example. FIG. 1A is a schematic view of a PEALD apparatus, desirably in conjunction with controls programmed to conduct the sequences escribed herein, usable in some embodiments of the present invention. In this figure, by providing a pair of electrically conductive flat-plate electrodes 4, 2 in parallel and facing each other in the interior 11 (reaction zone) of a reaction chamber 3, applying HRF power (13.56 MHz or 27 MHz) 20 to one side, and electrically grounding the other side 12, a plasma is excited between the electrodes.

A temperature regulator is provided in a lower stage 2 (the lower electrode), and a temperature of a substrate 1 placed thereon is kept constant at a given temperature. The upper electrode 4 serves as a shower plate as well, and reactant gas (and noble gas) and precursor gas are introduced into the reaction chamber 3 through a gas line 21 and a gas line 22, respectively, and through the shower plate 4.

Additionally, in the reaction chamber 3, a circular duct 13 with an exhaust line 7 is provided, through which gas in the interior 11 of the reaction chamber 3 is exhausted. Additionally, a transfer chamber 5 disposed below the reaction chamber 3 is provided with a seal gas line 24 to introduce seal gas into the interior 11 of the reaction chamber 3 via the interior 16 (transfer zone) of the transfer chamber 5 wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition of multi-element film and surface treatment are performed in the same reaction space, so that all the steps can continuously be conducted without exposing the substrate to air or other oxygen-containing atmosphere. In some embodiments, a remote plasma unit can be used for exciting a gas.

Figure 1B:
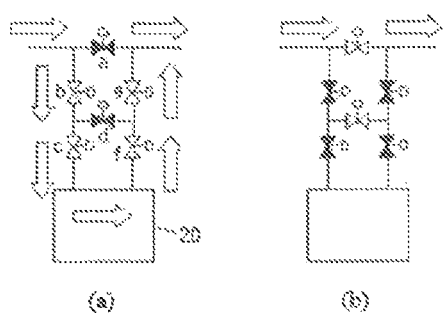
FIG. 1B illustrates a schematic representation of a precursor supply system using a flow-pass system (FPS) usable in an embodiment of the present invention.

In some embodiments, in the apparatus depicted in FIG. 1A, the system of switching flow of an inactive gas and flow of a precursor gas illustrated in FIG. 1B (described earlier) can be used to introduce the precursor gas in pulses without substantially fluctuating pressure of the reaction chamber.

In some embodiments, a dual chamber reactor (two sections or compartments for processing wafers disposed closely to each other) can be used, wherein a reactant gas and a noble gas can be supplied through a shared line whereas a precursor gas is supplied through unshared lines.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

The invention claimed is:

1. A method of filling one or more gaps on a surface of a substrate, the method comprising:
introducing a first reactant to the substrate with a first dose on a first area of the surface of the one or more gaps;
introducing a second reactant to the substrate with a second dose on a second area of the surface of the one or more gaps; and
introducing a third reactant to the substrate with a third dose, the third reactant reacting with the first reactant in the first area or the second reactant in the second area,
wherein one of the first reactant and the second reactant comprise a potential growth reactant,
wherein the other of the first and second reactant is a low growth reactant, and
wherein a cyclical process including the third reactant reacting with the potential growth reactant is used to fill the one or more gaps.

2. The method according to claim 1, wherein the method comprises removing any excess reactant and any byproduct after each step of introducing the first, the second, and the third reactant.

3. The method according to claim 1, wherein the deposition method comprises atomic layer deposition.

4. The method according to claim 1, wherein one of the first and the second reactants is introduced with a saturating dose and the other one of the first and second reactants is introduced with a subsaturating dose.

5. The method according to claim 1, wherein the third reactant is formed using an oxygen plasma.

6. The method according to claim 1, wherein the third reactant comprises a high growth reactant providing a relatively high growth in combination with the potential growth reactant.

7. The method according to claim 1, wherein the third reactant is introduced with a saturating dose.

8. The method according to claim 1, wherein the potential growth reactant comprises silicon.

9. The method according to claim 1, wherein the potential growth reactant comprises silanediamine.

10. The method according to claim 9, wherein the silanediamine comprises N,N,N',N'-tetraethyl silanediamine.

11. The method according to claim 1, wherein the low growth reactant comprises nitrogen.

12. The method according to claim 1, wherein the low growth reactant is activated by a plasma.

13. The method according to claim 1, wherein the third reactant comprises oxygen.

14. The method according to claim 1, wherein the third reactant comprises one or more of ozone and hydrogen peroxide.

15. The method according to claim 1, wherein the potential growth reactant comprises an organometal.

16. The method according to claim 15, wherein the organometal comprises an organoaluminium.

17. The method according to claim 16, wherein the organoaluminium comprises a trimethylaluminium.

18. A method of filling one or more gaps on a surface of a substrate, the method comprising:
   introducing a first reactant to the substrate with a first dose on a first area of the surface of the one or more gaps;
   introducing a second reactant to the substrate with a second dose on a second area of the surface of the one or more gaps, and
   introducing a third reactant to the substrate with a third dose, the third reactant reacting with the first or second reactant remaining on an area on the first and the second areas,
   wherein said one of the first and the second reactants is a potential growth reactant comprising an organometal, providing potential growth dependent on the other reactants, and wherein the other of said one of the first and the second reactants is a low growth reactant.

19. The method according to claim 18, wherein the organometal comprises an organoaluminium.

20. The method according to claim 19, wherein the organoaluminium comprises a trimethylaluminium.

* * * * *